US005694058A

United States Patent [19]
Reddy et al.

[11] Patent Number: 5,694,058
[45] Date of Patent: Dec. 2, 1997

[54] PROGRAMMABLE LOGIC ARRAY INTEGRATED CIRCUITS WITH IMPROVED INTERCONNECTION CONDUCTOR UTILIZATION

[75] Inventors: Srinivas T. Reddy, Santa Clara; Chiakang Sung, Milpitas; Bonnie I-Keh Wang, Cupertino, all of Calif.

[73] Assignee: Altera Corporation, San Jose, Calif.

[21] Appl. No.: 619,072

[22] Filed: Mar. 20, 1996

[51] Int. Cl.[6] ............................................. H03K 19/177
[52] U.S. Cl. ............................................................ 326/41
[58] Field of Search ................................. 326/39, 40, 41

[56] References Cited

U.S. PATENT DOCUMENTS

| | | | |
|---|---|---|---|
| Re. 34,363 | 8/1993 | Freeman | 326/41 |
| 3,473,160 | 10/1969 | Wahlstrom | 340/172.5 |
| 4,609,986 | 9/1986 | Hartmann et al. | 364/200 |
| 4,617,479 | 10/1986 | Hartmann et al. | 326/45 |
| 4,642,487 | 2/1987 | Carter | 326/41 |
| 4,677,318 | 6/1987 | Veenstra | 326/40 |
| 4,713,792 | 12/1987 | Hartmann et al. | 364/900 |
| 4,758,745 | 7/1988 | Elgamal et al. | 326/41 |
| 4,774,421 | 9/1988 | Hartmann et al. | 326/44 |
| 4,871,930 | 10/1989 | Wong et al. | 326/39 |
| 4,899,067 | 2/1990 | So et al. | 326/38 |
| 4,912,342 | 3/1990 | Wong et al. | 326/40 |
| 5,023,606 | 6/1991 | Kaplinsky | 340/825.8 |
| 5,122,006 | 6/1992 | Pedersen | 326/38 |
| 5,144,166 | 9/1992 | Camarota et al. | 326/41 |
| 5,208,491 | 5/1993 | Ebeling et al. | 326/41 |
| 5,220,214 | 6/1993 | Pedersen | 326/46 |
| 5,241,224 | 8/1993 | Pedersen et al. | 326/41 |
| 5,258,668 | 11/1993 | Cliff et al. | 326/41 |
| 5,260,610 | 11/1993 | Pedersen et al. | 326/41 |
| 5,260,611 | 11/1993 | Cliff et al. | 326/39 |
| 5,274,581 | 12/1993 | Cliff et al. | 364/784 |
| 5,350,954 | 9/1994 | Patel | 326/39 |
| 5,371,422 | 12/1994 | Patel et al. | 326/41 |
| 5,448,186 | 9/1995 | Kawata | 326/41 |
| 5,483,178 | 1/1996 | Costello et al. | 326/41 |
| 5,552,721 | 9/1996 | Gould | 328/39 |
| 5,592,102 | 1/1997 | Lane et al. | 326/41 |
| 5,594,365 | 1/1997 | Agrawal et al. | 326/40 |
| 5,614,840 | 3/1997 | McClintock et al. | 328/41 |

OTHER PUBLICATIONS

R. C. Minnick, "A Survey of Microcellular Research," Journal of the Association for Computing Machinery, vol. 14, No. 2, pp. 203–241, Apr. 1967.

S. E. Wahlstrom, "Programmable Logic Arrays—Cheaper by the Millions," Electronics, Dec. 11, 1967, pp. 90–95.

*Recent Developments in Switching Theory*, A. Mukhopadhyay, ed., Academic Press, New York, 1971, chapters VI and IX, pp. 229–254 and 369–422.

El Gamal et al., "An Architecture for Electrically Configurable Gate Arrays," IEEE Journal of Solid–State Circuits, vol. 24, No. 2, Apr. 1989, pp. 394–398.

El-Ayat et al., "A CMOS Electrically Cnfigurable Gate Array," IEEE Journal of Solid–State Circuits, vol. 24, No. 3, Jun. 1989, pp. 752–762.

"XC5000 Logic Cell Array Family, Technical Data, Advance Information," Xilinx, Inc., Feb. 1995.

*Primary Examiner*—Edward P. Westin
*Assistant Examiner*—Benjamin D. Driscoll
*Attorney, Agent, or Firm*—Fish & Neave; Robert R. Jackson

[57] ABSTRACT

In order to increase routing flexibility for the output signals of logic modules in programmable logic array integrated circuit devices, the output signal of each logic module can be swapped with the output signal of another logic module by a first level of signal swapping circuitry. The output signals of the first level of swapping circuitry can be further swapped with output signals of other first level swapping circuits by a second level of signal swapping circuitry to provide still more routing flexibility for the logic module output signals.

6 Claims, 3 Drawing Sheets

PROGRAMMABLE LOGIC ARRAY INTEGRATED CIRCUITS WITH IMPROVED INTERCONNECTION CONDUCTOR UTILIZATION

BACKGROUND OF THE INVENTION

This invention relates programmable logic array integrated circuit devices, and more particularly to improving the utilization of the interconnection conductors in such devices.

Commonly assigned, co-pending U.S. patent applications No. 08/442,795, filed May 17, 1995, and No. 08/545,084, filed Oct. 19, 1995 (both of which are hereby incorporated by reference herein), show examples of programmable logic array integrated circuit devices having large numbers of regions of programmable logic that are programmably interconnectable by a network of interconnection conductors. In devices of this general type the logic regions may include logic modules, each of which is programmable to perform any of several relatively elementary logic functions (e.g., providing any logical combination of four inputs, performing one place of binary arithmetic, registering or not registering a logic signal, etc.). The logic modules may be grouped into a plurality of logic array blocks ("LABS"), each of which includes several adjacent logic modules. Local feedback conductors may be provided in each LAB to allow output signals of the logic modules in that LAB to be used as inputs to logic modules in that LAB. In addition, the above-mentioned programmable network of interconnection conductors is provided for conveying signals to, from, and between the LABs. For example, the LABs may be disposed on the device in a two-dimensional array of intersecting rows and columns. The interconnection conductor network may include a plurality of "horizontal" conductors associated with each row of LABs, and a plurality of "vertical" conductors associated with each column of LABs. The horizontal conductors convey signals along the rows of LABs. The vertical conductors convey signals along the columns of LABs. Programmable connections may be provided for selectively interconnecting horizontal and vertical conductors. Block feeding conductors may be provided for selectively bringing signals on horizontal and/or vertical conductors into the LABs. Output conductors and drivers may be provided for applying output signals of the LABs to horizontal and/or vertical conductors.

In these types of devices, it is generally not regarded as economical to provide such large amounts of interconnection resources that all possible interconnections can be made simultaneously without some interconnections being blocked by other interconnections. Such completely general or universal interconnection resources would consume too large a fraction of the overall resources (e.g., area) of the device, and would be largely unused in most applications of the device. Instead, a design objective is to find a subset of the universal interconnection set which supports very wide application of the device, without consuming an undue portion of the overall resources of the device.

The devices shown in the two references mentioned above may have a feature which is helpful in increasing the usability of the interconnection resources that are provided in those devices. This feature is the provision of so-called "swap" programmable logic connectors ("PLCs") in the output circuitry of the logic regions. This programmable swap circuitry allows the output signals of two logic modules, which may be respectively in two adjacent LABs, to be swapped prior to application of those signals to drivers that apply those signals to horizontal and/or vertical interconnection conductors. This means that if the output signal of a logic module that needs to get out to a horizontal and/or vertical conductor cannot do so because the horizontal and/or vertical conductor normally available to that logic module is already in use for another purpose, that output signal can instead be fed out through the swap circuitry to the horizontal and/or vertical conductor(s) normally associated with the other logic module with which the first logic module is paired for swapping. This is helpful in reducing signal routing blockages and thereby increasing the usability of the device.

There are circumstances, however, in which it would be desirable to have more flexibility regarding feeding out the output signal of a logic module whose normal output drivers and output interconnection conductors have been taken over by the logic module with which the first logic module is paired for swapping. The interconnection conflict or conflicts of the first logic module that prompted swapping with a second logic module may also be a conflict for the second logic module. Thus it would be desirable to have more output options available for each logic module.

In view of the foregoing, it is an object of this invention to provide improved interconnection resources for programmable logic array integrated circuit devices.

It is a more particular object of this invention to provide programmable logic array integrated circuit devices with greater routing flexibility for the output signals of the logic modules in those devices.

SUMMARY OF THE INVENTION

These and other objects of the invention are accomplished in accordance with the principles of the invention by providing at least two levels of swap switching for the output signals of the logic modules in programmable logic array integrated circuit devices. A first of these swap switching levels may be substantially as shown in either of the two references mentioned above. Thus each logic module is paired with another logic module for possible, programmably controlled swapping of their output signals. These first level pairs are preferably mutually exclusive of one another. In a second level of programmable swap switching circuitry, each output of the above-described first level swap switching is paired for possible swapping with an output of the first level swap switching of another pair of logic modules. These second level pairs are also preferably mutually exclusive of one another. Assuming that only two levels of swap switching are thus provided, the output signals of the second level swap switching circuits are applied to the drivers that drive the horizontal and/or vertical interconnection conductors of the device. With two levels of swap switching, each logic module output signal has four possible outlets to the horizontal and/or vertical conductors. This greatly increases logic module output signal routing flexibility in the device.

Further features of the invention, its nature and various advantages, will be more apparent from the accompanying drawings and the following detailed description of the preferred embodiments.

DETAILED DESCRIPTION OF THE PREFERRED EMBODIMENTS

Figure 1:
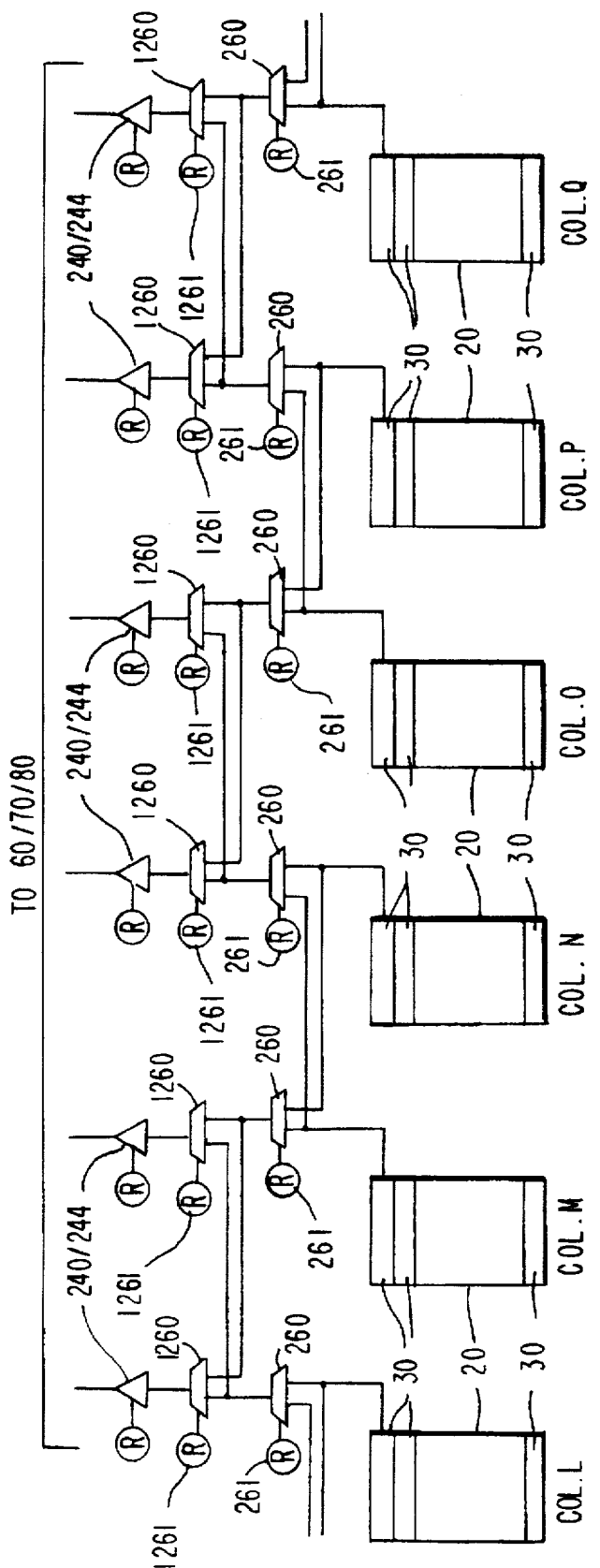
FIG. 1 is a simplified schematic block diagram of a representative portion of an illustrative programmable logic array integrated circuit device constructed in accordance with the principles of the invention.

A representative portion of a programmable logic array integrated circuit device of the type shown in the two references mentioned above is shown in FIG. 1. To facilitate comparison to those two references and the present invention, the reference numbers used in those references are used again herein for the same or similar components. Components that are new herein have reference numbers over 1000. Thus FIG. 1 herein shows one logic region or LAB 20 from each of several representative adjacent columns of LABs. FIG. 1 further shows that each LAB 20 is made up of several logic modules 30. Output connections are shown for one logic module 30 in each LAB 20. It will be understood, however, that this output connection circuitry is duplicated for all logic modules in all LABs.

As shown in FIG. 1, horizontally adjacent columns are paired for a first level of possible logic module output signal swapping by programmable logic connectors ("PLCs") 260. For example, the depicted LAB in column M is paired with the depicted LAB in column N, and the depicted LAB in column O is paired with the depicted LAB in column P. Thus the output signal of a logic module 30 in column M is applied to one input of a PLC 260 in column M, and also to one input of a PLC 260 in column N. The output signal of a logic module 30 in column N is applied to the other inputs of these two PLCs 260. Each PLC 260 (e.g., a multiplexer) is controlled by an associated programmable memory element 261 to pass either of its two inputs to its output. (The term PLC as used herein has the same meaning as in the two references mentioned above.)

From the foregoing it will be seen that the output signal of each logic module 30 can remain in the column that includes that logic module, or it can be switched to the adjacent column that is paired with that column for logic module output signal swapping. This first level of logic module output signal swapping is similar to the logic module output signal swapping shown in the two references mentioned above.

In accordance with the present invention, a second level of logic module output signal swapping is provided by PLCs 1260. The output signal of the PLC 260 in each column is applied to one input terminal of a PLC 1260 in that column and to one input terminal of a PLC 1260 in an adjacent column which is not the adjacent column that the PLC 260 being considered can receive an input from. In effect, this forms a second level of pairing of the adjacent columns, which second level is shifted from the first level. Thus in this second level of pairing the depicted PLC 260 in column L is paired with the depicted PLC 260 in column M, the depicted PLC 260 in column N is paired with the depicted PLC 260 in column O, and the depicted PLC 260 in column P is paired with the depicted PLC 260 in column Q. To consider one representative second level pair in more detail, the output signal of the depicted PLC 260 in column L is applied to one input of the depicted PLC 1260 in column L and to one input of the depicted PLC 1260 in column M. The output signal of the depicted PLC 260 in column M is applied to one input of the depicted PLC 1260 in column L and to one input of the depicted PLC 1260 in column M. Each PLC 1260 is controlled by a programmable memory element 1261 to pass either of its inputs to its output. Thus PLCs 1260 allow each PLC 260 output signal either to remain in the column that includes that PLC 260 or to be switched to the adjacent column that is paired with that column in the second level of pairing.

The output signal of each PLC 1260 is applied to drivers 240/244 that selectively drive selected horizontal interconnection conductors 60/70 and selected vertical interconnection 80 (not shown herein, but shown in the references mentioned above). It will be appreciated that (as in the devices shown in the above-mentioned references) the drivers 240/244 associated with each PLC 1260 can drive only certain ones (less than all) of the horizontal and vertical conductors 60/70/80 associated with the row and column that include that PLC 1260. Moreover, the horizontal conductors 60/70 that are drivable through the drivers 244 associated with each PLC 1260 tend to be different from the horizontal conductors 60/70 that are drivable through the drivers 244 associated with the PLC 1260 that is paired with the first PLC 1260 for swapping. Thus swapping, either at the level of PLCs 260 or at the level of PLCs 1260, tends to give each logic module output signal access to more of horizontal conductors 60/70 than is possible through just the drivers 244 in the column that includes that logic module. In particular, the combined effect of the two levels of swapping (first at the level of PLCs 260, then at the level of PLCs 1260) gives each logic module output access to four different sets of drivers 240/244. Assuming that each of these sets of drivers drives different ones of conductors 60/70/80, the two levels of swapping give each logic module output signal access to four times as many conductors 60/70/80 as would be the case if no swapping were provided. For example, the output signal of the depicted topmost logic module 30 in the LAB 20 shown in column M can be applied to the drivers 240/244 in any of columns L, M, N, and O. Thus this output signal can be applied to one or more vertical conductors 80 associated with any of these four columns and/or to one or more horizontal conductors 60/70 drivable by the drivers 244 in any of these four columns. This greatly increases the flexibility with which logic module output signals can be coupled into the interconnection conductor network. It also reduces the potential for blocking of a logic module output due to use of the first level of swap switching circuitry. If both of the logic modules that are paired at the first level of swapping need to get their outputs out to the interconnection conductor network, and the normal output drivers 240/244 of one of those logic modules do not connect to otherwise unused conductors, the second level of swapping is available to increase the chances that the outputs of both logic modules can be connected to available interconnection conductors.

The greater logic module output signal routing flexibility afforded by this invention may allow devices which include it to serve more applications. Alternatively, the invention may allow the amount of interconnection conductor resources on devices to be reduced, with no reduction in the utility of those devices.

Figure 2:
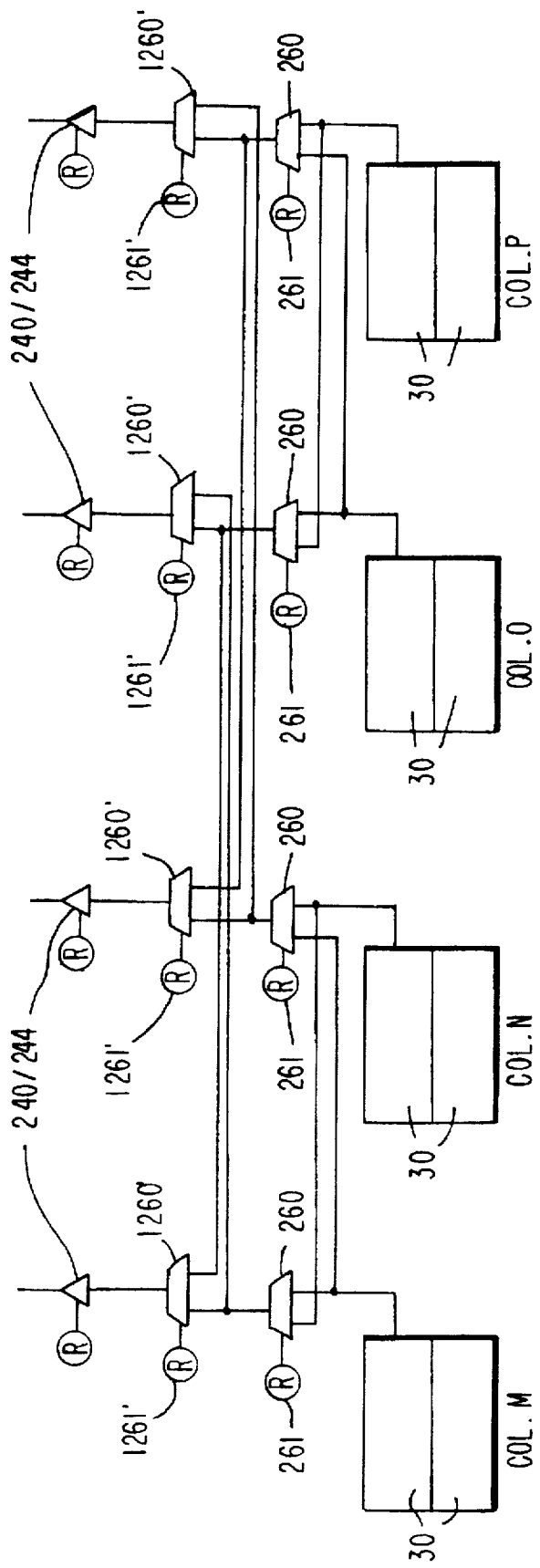
FIG. 2 is a view similar to a portion of FIG. 1 showing an alternative illustrative embodiment of the invention.
Figure 3:
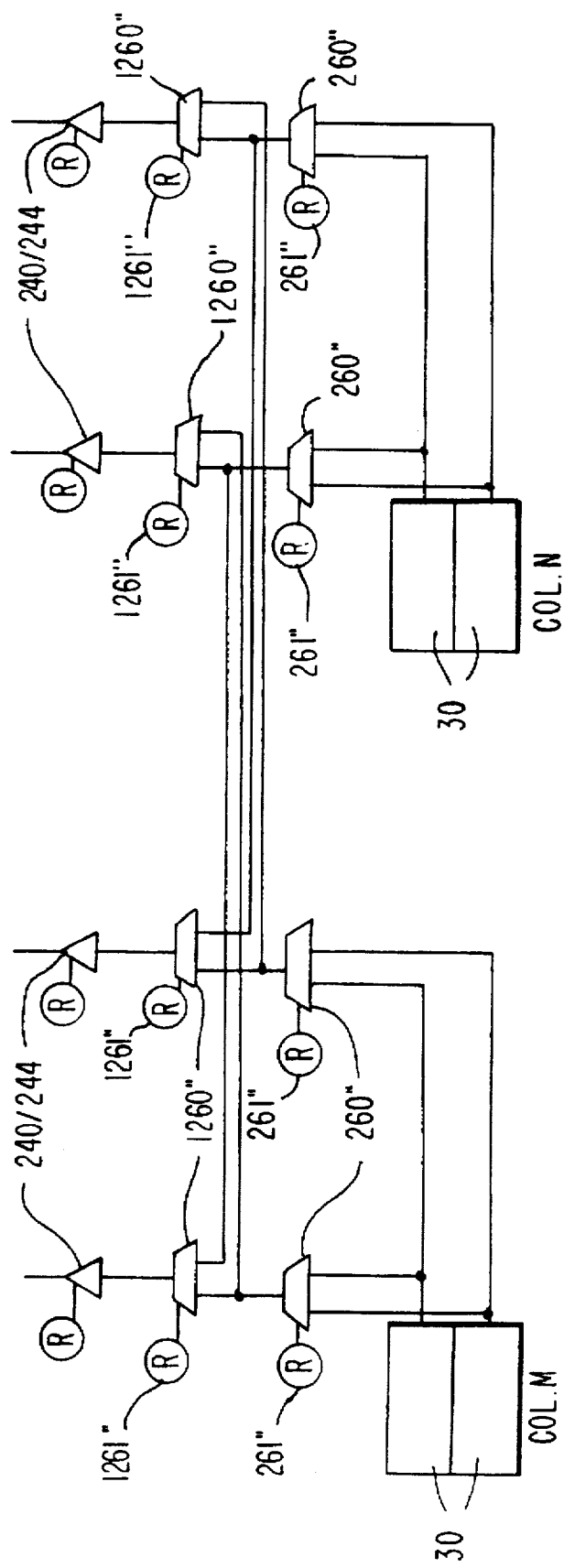
FIG. 3 is another view similar to a portion of FIG. 1 showing another alternative illustrative embodiment of the invention.

Although FIG. 1 shows horizontally aligned logic modules 30 being paired for output signal swapping at both levels, this is not necessary at either level. The pairing at either or both levels could be of logic modules that are not horizontally aligned. Nor does the pairing at either level have to be of logic modules that are in immediately adjacent columns. For example, FIG. 2 shows an alternative illustrative embodiment in which the first level of pairing is the same as in FIG. 1, but at the second level, columns more remote than immediately adjacent columns are paired. Thus in the second level the outputs of PLCs 260 in columns M and O are paired for swapping by being applied to the PLCs 1260' in those columns, while the outputs of PLCs 260 in columns N and P are paired for swapping by being applied to the PLCs 1260' in those columns. In the further alternative illustrative embodiment shown in FIG. 3, vertically adjacent logic modules 30 in each column are paired for swapping at the first level. Thus the outputs of the first and second logic modules 30 in column M are applied to both of two PLCs 260" in that column, while the outputs of the first and second logic modules 30 in column N are applied to both of two PLCs 260" in that column. In the second level of pairing the output of one PLC 260" in each of columns M and N is applied to one PLC 1260" in each of those columns, while the output of the other PLC 260" in each column is applied to the other PLC 1260" in each column. As in FIG. 1, the result of the two-level swapping arrangements shown in FIGS. 2 and 3 is that the output of each logic module 30 can get to any of four sets of drivers 240/244.

It will be understood that the foregoing is only illustrative of the principles of this invention, and that various modifications can be made by those skilled in the art without departing from the scope and spirit of the invention. For example, the particular programmable logic array integrated circuit architecture in connection with which the invention has been described is only illustrative, and the invention is equally applicable to many other device architectures. Any of the various technologies mentioned in the two references incorporated above can be used to implement the various components of devices constructed in accordance with this invention. Although two levels of swap switching are described in detail herein, it will be readily apparent that more levels of such switching can be added if desired.

The invention claimed is:

1. A programmable logic array integrated circuit device comprising:

a plurality of regions of programmable logic, each being capable of producing an associated output signal, said regions being grouped in a plurality of pairs of said regions;

a first signal swapping circuit associated with each of said pairs of logic regions, each of said first swapping circuits having two output terminals and being programmable to apply the output signal of either of the logic regions in the associated pair to either of said output terminals, said output terminals being grouped in a plurality of pairs of said output terminals such that the output terminals in each such pair are output terminals of different ones of said first swapping circuits; and a second signal swapping circuit associated with each of said pairs of output terminals, each of said second swapping circuits having two output leads and being programmable to connect either of the output terminals in the associated pair of output terminals to either of the output leads of said second swapping circuit.

2. The apparatus defined in claim 1 wherein said pairs of said regions are mutually exclusive of one another.

3. The apparatus defined in claim 1 wherein said pairs of said output terminals are mutually exclusive of one another.

4. The apparatus defined in claim 1 further comprising:

a plurality of interconnection conductors for use in making connections between various ones of said logic regions; and an output circuit associated with each of said output leads for connecting the associated output lead to a respective subset of said interconnection conductors.

5. The apparatus defined in claim 4 wherein each of said output circuits comprises:

a driver circuit for selectively connecting the associated output lead to said respective subset of said interconnection conductors.

6. The apparatus defined in claim 1 wherein each of said pairs of said output terminals includes output terminals of a pair of said first signal swapping circuits, each of said pairs of said first signal swapping circuits being different from substantially all others of said pairs of said first signal swapping circuits.

* * * * *